United States Patent [19]

Dekura et al.

[11] Patent Number: 4,796,132
[45] Date of Patent: Jan. 3, 1989

[54] THIN FILM MAGNETIC HEAD HAVING AU ULTRASONIC CONNECTION STRUCTURE

[75] Inventors: Yoshinori Dekura, Hadano; Kazuhiro Momata, Chigasaki; Tokiyuki Seto, Odawara, all of Japan

[73] Assignee: Hitachi, Ltd., Tokyo, Japan

[21] Appl. No.: 111,284

[22] Filed: Oct. 22, 1987

[30] Foreign Application Priority Data

Oct. 24, 1986 [JP] Japan .................. 61-251629

[51] Int. Cl.⁴ .......................... G11B 5/12; G11B 5/30
[52] U.S. Cl. .................................... 360/113; 360/125
[58] Field of Search ................ 360/113, 110, 125–127

[56] References Cited

U.S. PATENT DOCUMENTS 3,908,194  9/1975  Romankiw .................. 360/113
4,520,413  5/1985  Piotrowski et al. ............. 360/113
4,622,613  11/1986  Nomura et al. ............... 360/113
4,642,716  2/1987  Wakabayashi et al. .......... 360/104

Primary Examiner—John H. Wolff
Attorney, Agent, or Firm—Fay, Sharpe, Beall, Fagan, Minnich & McKee

[57] ABSTRACT

Conductor film terminals of a thin film magnetic head are composed of an Au film while lead terminals of a flexible printed circuit board are covered with an Au layer, so that both of these terminals can be bonded by low temperature ultrasonic bonding directly between Au and Au. The reverse surface of the lead terminals of the flexible printed circuit board is bonded and fixed to a flexible polymer resin cover film so that the dimensional accuracy of the bonded terminal portion can be improved.

8 Claims, 2 Drawing Sheets

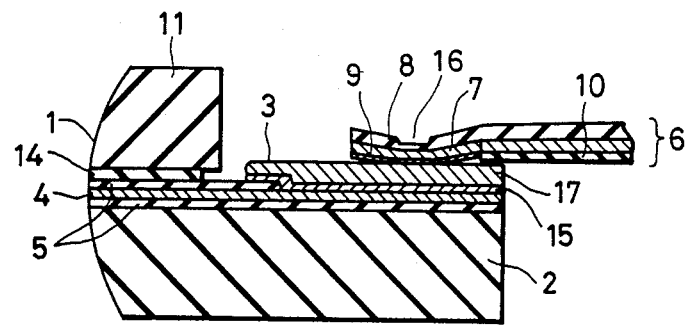
FIG. 1
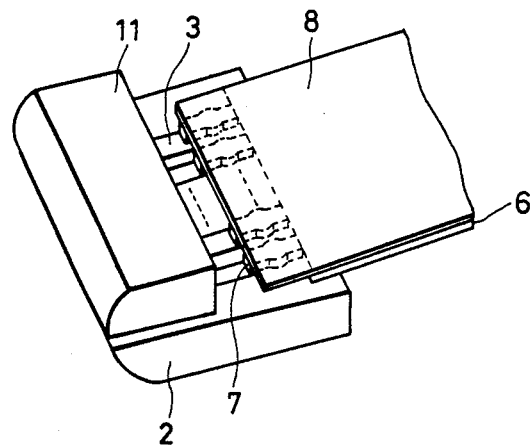
FIG. 2
FIG. 3
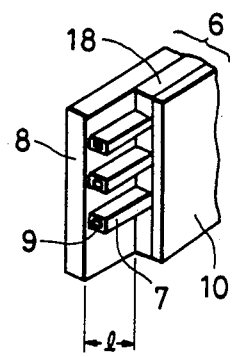

THIN FILM MAGNETIC HEAD HAVING AU ULTRASONIC CONNECTION STRUCTURE

BACKGROUND OF THE INVENTION

This invention relates generally to inductive type and magnetoresistive type thin film magnetic heads, and more particularly to connection between a conductor film terminal and a flexible printed circuit board. Here, the term "conductor film terminal" means an external connection terminal for applying a current to a thin film magnetic head and inputting an input signal or outputting an output signal, made of a conductor film.

A thin film magnetic film consists of a head element fabricated by use of thin film processing technique such as sputtering, vacuum deposition, photoetching, and so forth. Particularly because delicate machining is possible, the thin film magnetic head can accomplish high density packaging and can realize a magnetic head having a small track width. The inductive type thin film magnetic head is produced by forming a lower thin magnetic film of permalloy (high permeability Ni-Fe alloy such as Ni-25%Fe alloy) or the like on a non-magnetic substrate such as glass by plating or vacuum deposition, forming then a conductor film having a predetermined pattern in such a manner as to cover the lower thin magnetic film, forming an upper thin magnetic film on the conductor film through an insulating film and extending the conductor film on the thin magnetic film head substrate for external connection.

Accordingly, the terminal width of the conductor film becomes very small as the track width becomes small. When the substrate of the thin film magnetic head is made of a magnetic material such as ferrite and is used also as the lower thin magnetic film, the terminal width of the conductor film becomes very small, too, with miniaturization of the track width. On the other hand, a thin film magnetic head of a magnetoresistive type which is used for reproduction only employs a magnetoresistive element, but the terminal width of the conductor film becomes likewise very small with the increase in the number of tracks. It is therefore necessary to improve the pitch accuracy between the terminals of adjacent tracks due to external connection. Moreover, a connection structure is necessary for external connection at the terminal of the conductor film which does not exert adverse influences on the thin film formation portion.

Hereinafter, a prior art example will be explained. Generally, the conductor film terminals 3 for external connection are formed on the surface of the magnetoresistive element 4 on the non-magnetic substrate 2', as shown in FIG. 4 and these conductor film terminals 3 are connected to a large number of lead terminals 7 exposed at one of the ends of the flexible printed circuit board 6 by a wire 12 made of Au, Al or the like. A connection method which connects both ends of wire to the counter-part is employed for this connection in accordance with wire bonding technique or the like. However, since connection is made at both ends of the Al or Au wire 12 and between a large number of terminals, bonding connection is necessary at a large number of spots. Incidentally, reference numeral 1 in FIG. 4 represents the thin film magnetic head and 5 does the insulating film.

The head described in another prior art reference, i.e. Japanese Patent Laid Open No. 172106/1984, will be explained. FIG. 5 of the accompanying drawings shows the main structural portion of the multi-channel thin film magnetic head 1 of this prior art. The magnetoresistive element 4 made of Fe-Ni alloy or Ni-Cr alloy is formed on the non-magnetic substrate 2' and the conductor film terminal 3 for connection with the flexible printed circuit board 6 is formed on the magnetoresistive element 4. The lead terminal 7 of the flexible printed circuit board 6 consisting partly of a transparent member 8' has Sn-Pb alloy 9' put thereto. After the lead terminal 7 is located to the conductor film terminal 3, laser beam is radiated through a glass sheet 13 to fuse the Sn-Pb alloy 9' so that a large number of connection spots between the lead terminal 7 of the flexible printed circuited board 6 and the conductor film terminal 3 can be connected exclusively by a reflow soldering method. Incidentally, reference numeral 10 in FIG. 5 represents a base film and 5 represents the insulating film.

The structure of the prior art techniques described above wherein the flexible printed circuit board and the conductor film of the thin film head are connected at both ends of the Al or Au wire involves the problem that since the number of connection points is great, workability is low and the number of manhour increases. The other prior art reference described above, i.e. Japanese Patent Publication No. 172106/1984, requires essentially the structure wherein the upper part of the lead terminal of the flexible printed circuit board is composed of the transparent material in order to fuse the solder of the lead terminal by use of the laser beam. Therefore, this technique is not suitable for the flexible printed circuit board having an opaque portion and imposes a structural limitation to the flexible printed circuit board. In order to fuse the solder, the connection portion must be heated to a high temperature near 300° C. and not only the conductor film at the connection corresponding portion but also the thin film head structure itself must have heat resistance to this temperature. Accordingly, the structure of the thin film head element is limited by the problem of connection. Moreover, accuracy of pitch cannot be kept at the time of high density packaging due to non-uniformity of the thickness of the Sn-Pb alloy layer on the lead terminal of the flexible printed circuit board or due to the thermal deformation of the film on the reverse of the lead terminal of the flexible printed circuit board, and adjacent terminals are likely to come into contact with one another.

SUMMARY OF THE INVENTION

The object of the present invention is to provide a connection structure which does not exert any adverse influences on a thin film head structure when connecting the lead terminal of the flexible printed circuit board to the terminal of the conductor film of the thin film magnetic head, which keeps highly accurate connection, and which makes it possible to carry out low temperature bonding with a high level of workability.

The object of the invention described above can be accomplished by making it possible to connect both terminals by an ultrasonic bonding method with a low temperature rise by forming an Au film as the terminal of the conductor film of the thin film magnetic head and an Au layer of the lead terminal of the flexible printed circuit board, and by bonding and fixing the lead terminal of the flexible printed circuit board to the flexible film of the flexible printed circuit board while keeping the dimensional accuracy between the lead terminals at a high level of accuracy.

Namely, the thin film magnetic head in accordance with the present invention includes (i) conductor film terminals for applying a current to a head and inputting an input signal or picking up an output signal and (ii) a flexible printed circuit board having lead terminals connected to the conductor film terminals, wherein at least the surface of the conductor film terminal is made of an Au film, the surface of the lead terminal is made of an Au layer, the Au film and the Au layer are bonded to each other, the surface of the lead terminal on the opposite side to the bonded surface to the conductor film terminal is bonded and fixed to a flexible film (cover film) and this flexible film covers the bond portion between the Au film and the Au layer.

The thin film magnetic head in accordance with the present invention may have the same structure as that of the thin film magnetic head of the prior art except that at least the surface of the conductor film terminal and the surface of the lead terminal of the flexible printed circuit board are made of Au and the lead terminal is fixed to the flexible cover film on its surface opposite to the bonded surface to the conductor film terminal.

In the present invention, the Au film is formed as the conductor film terminal in order to improve corrosion resistance of the conductor film when a large number of conductor film terminals of the thin film magnetic head are connected to the lead terminals of the flexible printed circuit board, and the Au layer is formed on the surface of a large number of lead terminals of the flexible printed circuit board. This structure makes it possible to employ the ultrasonic bonding technique for the connection between them. Therefore, any adverse influences resulting from the temperature rise at the time of the connecting operation upon other constituent elements such as the conductor film, the magnetoresistive element film, and the like, are not exerted. Moreover, the reverse surface of a large number of lead terminals of the flexible printed circuit board (that is, the surface opposite to the conductor film terminals) is bonded to and fixed by the cover film so that the pitch accuracy of the lead terminals of the flexible printed circuit board can be improved and troubles such as contact between the adjacent terminals, insulation defect, and the like, do not occur due to improvement in the connection accuracy with the conductor film terminals. Since the present invention does not use the wire connection method, workability is high.

BRIEF DESCRIPTION OF THE DRAWINGS

FIG. 1 is a sectional view showing the principal portions of a thin film magnetic head in one embodiment of the present invention;

FIG. 2 is a perspective view of the thin film magnetic head in the one embodiment of the present invention;

FIG. 3 is a perspective view of a flexible printed circuit board in the thin film magnetic head in the one embodiment of the present invention;

DESCRIPTION OF THE PREFERRED EMBODIMENTS

Figure 4:
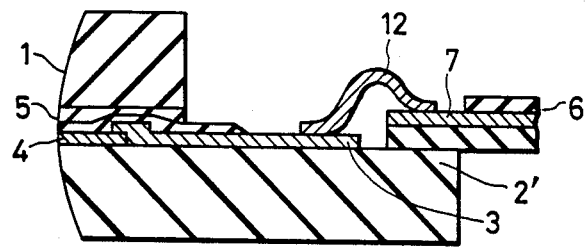
FIGS. 4 and 5 are sectional views showing the principal portions of conventional thin film magnetic heads, respectively.
Figure 5:
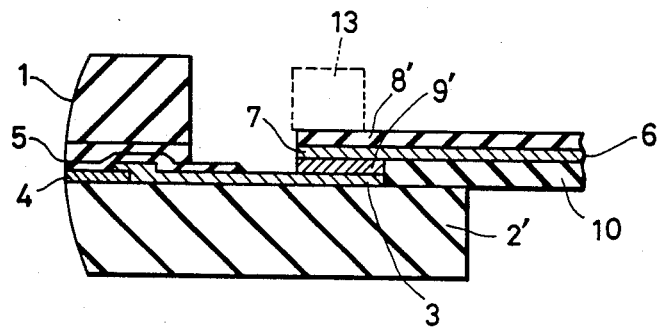

Hereinafter, one embodiment of the present invention will be described with reference to FIGS. 1, 2 and 3. As shown in FIG. 1, an insulation film 5 of $Al_2O_3$ or the like is formed on a magnetic substrate 2 of ferrite or the like by sputtering, and a magnetoresistive element 4 made of Ni-Fe alloy or the like is formed on the insulation film 5 by vaccum deposition, and is shaped by photoetching, or the like technique. Furthermore, the same insulation film 5 of $Al_2O_3$ as described above is again formed on the magnetoresistive element 4 by sputtering and photoetching. A block 11 made of the same material as, or a different material from, the material of the substrate 2 is bonded and fixed on this second insulation film 5 by an adhesive 14. On the other hand, a plurality of conductor film terminals 3 of the thin film magnetic head 1 are positioned on the upper insulation film 5 of $Al_2O_3$ and the magnetoresistive element 4 and a 0.03 to 0.15 $\mu$m-thick Ti film 15 as a under film is formed thereon as a connection surface to the outside by sputtering, or the like. Furthermore, a 0.5 to 1.0 $\mu$m-thick Au film as a corrosion-resistant conductor film is formed by sputtering, and, thereafter they are shaped. Cr, Ta or Mo film may be used in place of this Ti film 15.

The Au film 17 of the conductor film terminals 3 is from 0.2 to 1.5 $\mu$m thick. In this embodiment, the Au film 17 is 0.5 to 1.0 $\mu$m thick. If this thickness is below 0.2 $\mu$m, quality of the Au film becomes nonuniform and if it is above 1.5 $\mu$m, bonding strength of the Au film drops, undesirably.

The conductor film terminal is 0.16 mm wide and the pitch between the conductor film terminals is 0.315 mm. These terminals extend on the side opposite to the surface facing a magnetic recording medium.

The flexible printed circuit board 6 to be connected to the conductor film terminals 3 as the output port of the thin film magnetic head 1 has the structure such as shown in FIG. 3. Namely, a large number of lead terminals 7 are bonded to a flexible cover film 8 made of a polymer resin together with a base film 10 which is cut away partially, and the dimensional errors of the pitch between the lead terminals and the width of each terminal are suppressed within about ±0.02. Examples of the polymer resin constituting the flexible cover film 8 are a polyimide resin and a polyester resin. The cover film 8 is from 12.5 to 50 $\mu$m thick, and it is 25 $\mu$m thick in this embodiment. If the thickness of the cover film is within this range, ultrasonic bonding can be made between the conductor film terminals and the lead terminals by putting the tool of ultrasonic bonding from above the cover film.

Each lead terminal 7 is made of a Cu material having an Au layer 9 deposited on its surface by plating, or the like. The Au layer 9 is preferably from 1 to 10 $\mu$m thick, and it is 5 $\mu$m ±1 $\mu$m thick in this embodiment. If the thickness of the Au layer is smaller than the range described above, the Au layer is likely to become nonuniform and if the thickness is above the range, the production cost will become higher, undesirably.

Examples of the adhesive for fixing the lead terminals 7 to the cover film 8 are epoxy type adhesives and acrylic type adhesives.

The cover film 8 covers the reverse surface of all the lead terminals connected to the conductor film terminals and extends from the upper surface of the lead terminal portion to a connector connection portion of the flexible printed circuit board (which exists on the opposite side of the printed circuit board to the lead terminal side, and is not shown in the drawing). The cover film 8 covers also the entire surface of the printed circuit board with the exception of holes for connector connection. The base film 10 is cut partly and the cover film 8 is exposed. This exposed length l is from 0.5 to 1.5 mm.

In this embodiment, the lead terminal 7 is 0.035 mm high and 0.06 to 0.1 mm wide, and the pitch between the lead terminals is 0.315 mm.

FIG. 2 is a perspective view showing the state where the conductor film terminals 3 of the thin film magnetic head 1 having the structure described above are bonded to the flexible printed circuit board 6 by an ultrasonic bonding method with a small temperature rise, and FIG. 1 shows the section of the connection portion between them. The connection portion provides the structure suitable for ultrasonic bonding at a low temperature between Au and Au by the combination of the Au layer 9 of the lead terminals 7 of the flexible printed circuit board 6 and the Au film 17 of the conductor film teminals 3. The bonding temperature in this case is from 10° C. to 100° C. As to location of the connecting positions, the positions of the lead terminals 7 can be seen by operator's eyes with the cover film 8 is transparent or translucent. Therefore, each lead terminal 7 can be located to the center of the width of each conductor film terminal 3. If the cover film 8 is opaque, location can be made by setting in advance the distance from the end portion of the flexible printed circuit board 6 to the outermost lead terminal 7 and setting the relation of position between this outermost lead terminal 7 and the conductor film terminal to be connected by disposing a reference guide, or the like.

Furthermore, connection can be made by putting the bonding tool from above the cover film 8 and through this cover film 8. Namely, since the cover film 8 can be as thin as about 25 μm, it is crushed to form a push trace 16 and to transmit the push force as such to the Cu conductor when the bonding tool is pushed from above the cover film 8 to the Cu conductor having Au deposited thereto with the push force of about 20 kg/mm$^2$, so that the surface between Au of the conductor film and Au of the lead terminal is made flat with ultrasonic oscillation, the frictional coefficient between them becomes great, and the lead terminal 7 undergoes deformation, that is, it causes plastic flow with the result being the increase in the adhesion area and bonding between Au and Au.

The push force of ultrasonic bonding described above is preferably from 2 to 60 kg/mm$^2$. In this embodiment, it is 20 kg/mm$^2$. In this embodiment, ultrasonic bonding is made at the power of 20 W maximum, frequency of 35 to 110 KHz and the application time of ultrasonic wave of from 0.2 ms to 7 s.

In this embodiment, the temperature rise around the bond portion by ultrasonic bonding is at most about 20° C.

In FIG. 3, reference numeral 18 represents the adhesive.

This embodiment provides the following effects. First of all, the conductor film terminals 3 and the lead terminals 7 of the flexible printed circuit board 6 can be connected without causing any thermal problems of the constituent elements such as the conductor film of the thin film magnetic head. Second, the dimensional accuracy of the flexible printed circuit board 6 itself can be improved by use of the lead terminals 7 equipped with the cover film, whether it may be transparent or opaque, so that connection accuracy can be improved and the problems such as contact between the adjacent terminals at the connection portion can be eliminated. Thirdly, since the cover film is attached to the reverse surface of the lead terminals, the production yield of the flexible printed circuit board 6 can be improved and the cost of production of the components can be reduced.

Figure 6:
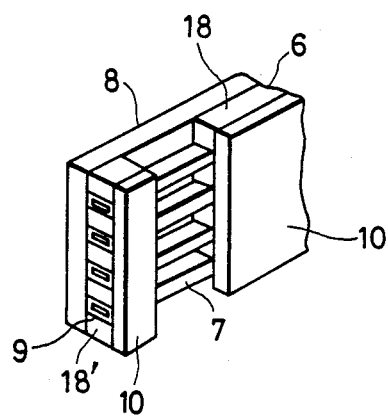
FIG. 6 is a perspective view of the flexible printed circuit board in the thin film magnetic head in another embodiment of the present invention.

FIG. 6 shows another embodiment of the present invention, wherein the structure of the flexible printed circuit board 6 shown in FIG. 3 is changed to the structure shown in FIG. 6 in which the flexible film 8 and the flexible base film 10 are bonded and fixed to both surfaces of the lead terminals at part of the tip. In this case, too, the structure of the connection portion is the same as that of the foregoing embodiment and its effect can be regarded as the same, too.

In FIG. 6, reference numerals 18 and 18' represent the adhesive.

In the embodiment given above, the present invention is applied to the magnetoresistive type thin film magnetic head, but the invention provides the same effect when applied to the inductive type thin film magnetic head by using the conductor film terminal as the coil terminal.

In each of the drawings, like reference numerals are used to identify like constituents.

In accordance with the present invention, the structure of the connection portion consists of connection between Au and Au. Therefore, low temperature bonding becomes possible and the influences of heat on the thin film head structure at the time of connection can be almost eliminated. Since the flexible printed circuit board having the lead terminals, which are equipped with the flexible film, is employed and since low temperature bonding connection is possible, pitch accuracy between the lead terminals as well as connection accuracy can be improved and since connection accuracy can thus be improved, problems such as mutual contact of the adjacent terminals and insulation defect, and the like, can be eliminated.

Though the present invention has thus been described in its preferred form, it is to be understood that various changes and modifications can be made by those skilled in the art without departing from the spirit and scope thereof.

What is claimed is:

1. In a thin film magnetic head for use with recording media, including:
    a substrate;
    thin film transducer means on said substrate for at least one of reading from and writing to the recording media with correlated electrical signals;
    conductor film terminal means on said substrate and electrically connected to said transducer means for carrying the signals and having a plurality of conductor film terminals with respective connection bonded surfaces;
    a flexible printed circuit board means having a corresponding plurality of lead terminals with respective connection bonded surfaces electrically connected to said conductor film terminal connection bonded surfaces for transmitting the signals between said printed circuit board means and said conductor film terminal means, and further having a cover film covering said lead terminal means;
    wherein the improvement comprises,
    at least the connection bonded surface of said conductor film terminals consists of an Au film, the connection bonded surface of said lead terminals consists of an Au layer, said Au film and said Au layer being directly bonded to each other, the surface of said lead terminals opposite to said connection bonded surfaces being bonded to and having their relative spacing fixed by said flexible cover film, and said flexible cover film covers at least the connection bonded portion between said Au film and said Au layer.

2. A thin film magnetic head according to claim 1, wherein said Au film is from 0.2 to 1.5 μm thick.

3. A thin film magnetic head according to claim 2, wherein said Au layers is from 1 to 10 μm thick.

4. A thin film magnetic head according to claim 3, wherein said flexible film consists of from 12.5 to 50 μm-thick polyimide resin film or polyester resin cover film.

5. A thin film magnetic head according to claim 1, wherein said Au layer is from 1 to 10 μm thick.

6. A thin film magnetic head according to claim 1, wherein said flexible cover film consists of a polymer resin film.

7. A thin film magnetic head according to claim 6, wherein said polymer resin cover film is composed of a polyimide resin or polyester resin.

8. The apparatus of claim 1, wherein the Au layer and Au film are ultrasonically bonded together.

* * * * *